United States Patent
Lee et al.

(10) Patent No.: US 8,824,188 B2
(45) Date of Patent: Sep. 2, 2014

(54) OPERATING METHOD FOR MEMORY DEVICE AND MEMORY ARRAY AND OPERATING METHOD FOR THE SAME

(75) Inventors: Feng-Min Lee, Hsinchu (TW); Yu-Yu Lin, New Taipei (TW); Ming-Hsiu Lee, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 117 days.

(21) Appl. No.: 13/567,750

(22) Filed: Aug. 6, 2012

(65) Prior Publication Data

US 2014/0036570 A1 Feb. 6, 2014

(51) Int. Cl.
*G11C 11/00* (2006.01)
*G11C 13/00* (2006.01)

(52) U.S. Cl.
CPC .................................. *G11C 13/0069* (2013.01)
USPC ....... 365/148; 365/163; 365/189.16; 365/100

(58) Field of Classification Search
CPC .......................... G11C 13/0004; G11C 13/0007
USPC .............................. 365/148, 163, 189.16, 100
See application file for complete search history.

(56) References Cited

U.S. PATENT DOCUMENTS

| | | | |
|---|---|---|---|
| 7,646,633 B2 * | 1/2010 | Fuji ................ | 365/163 |
| 8,488,365 B2 * | 7/2013 | Liu et al. ............ | 365/148 |
| 8,520,424 B2 * | 8/2013 | Kreupl et al. ........ | 365/148 |
| 8,576,609 B2 * | 11/2013 | Scheuerlein .......... | 365/148 |

FOREIGN PATENT DOCUMENTS

TW 101106356 2/2012

OTHER PUBLICATIONS

English language translation of abstract of TW 101106356 (pp. 1-2 of publication, published Feb. 24, 2012).
Kau, D.C., et al.; "A Stackable Cross Point Phase Change Memory;" IEEE; 2009; pp. 27.1.1-27.1.4.
Shenoy, R.S., et al; "Endurance and Scaling Trends of Novel Access-Devices for Multi-Layer Crosspoint-Memory based on Mixed-Ionic-Electronic-Conduction (MIEC) Materials;" Symposium on VLSI Technology Digest of Technical Papers; 2011; pp. 94-95.

* cited by examiner

*Primary Examiner* — Connie Yoha
(74) *Attorney, Agent, or Firm* — McClure, Qualey & Rodack, LLP

(57) ABSTRACT

An operating method for a memory device and a memory array and an operating method for the same are provided. The operating method for the memory device comprises following steps. A memory device is made being in a set state. A method for making the memory device being in the set state comprises applying a first bias voltage to the memory device. The memory device in the set state is read. A method for reading the memory device in the set state comprises applying a second bias voltage to the memory device. A recovering bias voltage is applied to the memory device. The step for applying the recovering bias voltage is performed after the step for applying the first bias voltage or the step for applying the second bias voltage.

20 Claims, 4 Drawing Sheets

OPERATING METHOD FOR MEMORY DEVICE AND MEMORY ARRAY AND OPERATING METHOD FOR THE SAME

BACKGROUND

1. Technical Field

The disclosure relates in general to a memory device and an operating method for the same and more particularly to a memory array and an operating method for the same.

2. Description of the Related Art

Along with the advance in semiconductor technology, electronic elements are kept being miniaturized, such that electronic products possess more and more functions when the size remains unchanged or become even smaller. As there are more and more information to be processed, the demand for the memory having larger capacity but smaller size is ever increasing.

Currently, the read-write memory stores data by means of a transistor structure assisted by a memory cell. However, the technology for manufacturing such memory has come to a bottleneck in terms of scalability. Therefore, more advanced memory structures, such as phase change random access memory (PCRAM), magnetic random access memory (MRAM), and resistive random access memory (RRAM), conductive bridging RAM (CBRAM) and so on are presented.

However, currently, there is still need to improve an operating efficiency of a memory device.

SUMMARY

An operating method for a memory device is provided. The method comprises following steps. A memory device is made being in a set state. A method for making the memory device being in the set state comprises applying a first bias voltage to the memory device. The memory device in the set state is read. A method for reading the memory device in the set state comprises applying a second bias voltage to the memory device. A recovering bias voltage is applied to the memory device. The step for applying the recovering bias voltage is performed after the step for applying the first bias voltage or the step for applying the second bias voltage.

An operating method for a memory array is provided. The method comprises following steps. A two-terminal memory device electrically connected between a word line and a bit line is made being in a set state. A method for making the two-terminal memory device being in the set state comprises applying a first bias voltage to the two-terminal memory device through the word line and the bit line. The two-terminal memory device in the set state is read. A method for reading the two-terminal memory device in the set state comprises applying a second bias voltage to the two-terminal memory device through the word line and the bit line. A recovering bias voltage is applied to the two-terminal memory device through the word line and the bit line. The step for applying the recovering bias voltage is after the step for applying the first bias voltage or the step for applying the second bias voltage.

A memory array is provided. The memory array comprises memory cells. Each of the memory cells comprises a first conductive line, a second conductive line and a memory device. The memory device comprises a first electrode layer, a second electrode layer and a solid state electrolyte structure. The first electrode layer is electrically connected to the first conductive line. The second electrode layer is electrically connected to the second conductive line. The solid state electrolyte structure is adjoined between the first electrode layer and the second electrode layer. The second electrode layer is functioned as a source for moving metal ions. The moving metal ions can move into the solid state electrolyte structure.

The above and other aspects of the disclosure will become better understood with regard to the following detailed description of the non-limiting embodiment(s). The following description is made with reference to the accompanying drawings.

DETAILED DESCRIPTION

Figure 1:
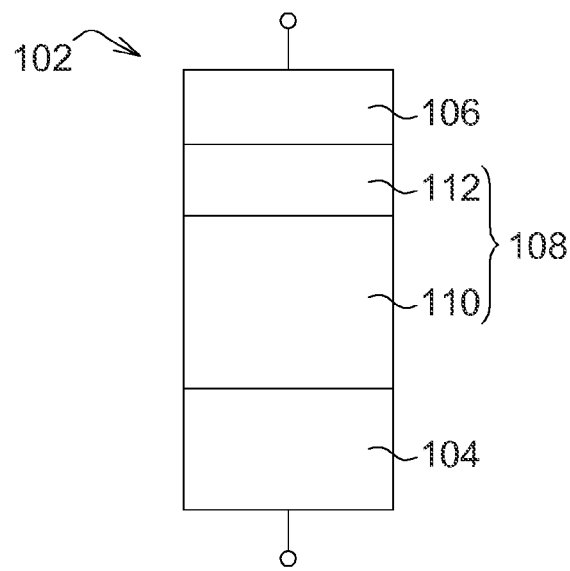
FIG. 1 illustrates a memory device according to one embodiment.

FIG. 1 illustrates a cross-section view of a memory device 102 according to one embodiment. The memory device 102 comprises a first electrode layer 104, a second electrode layer 106 and a solid state electrolyte structure 108. The solid state electrolyte structure 108 comprises a first solid state electrolyte layer 110 and a second solid state electrolyte layer 112. The first solid state electrolyte layer 110 is adjoined between the first electrode layer 104 and the second solid state electrolyte layer 112. The second solid state electrolyte layer 112 is adjoined between the first solid state electrolyte layer 110 and the second electrode layer 106. Embodiments are not limited to the solid state electrolyte structure 108 having two solid state electrolyte layers. In other embodiments, the solid state electrolyte structure (not shown) may have a single solid state electrolyte layer.

Referring to FIG. 1, in embodiments, the first electrode layer 104 is a conductive material not providing moving metal ions easily. The second electrode layer 106 is functioned as a source for providing moving metal ions that can move into the solid state electrolyte structure 108. The first solid state electrolyte layer 110 and the second solid state electrolyte layer 112 may have dielectric materials. A dielectric constant of the first solid state electrolyte layer 110 may be bigger than a dielectric constant of the second solid state electrolyte layer 112. A moving-metal-ion solubility of the first solid state electrolyte layer 110 may be higher than a moving-metal-ion solubility of the second solid state electrolyte layer 112. A moving-metal-ion solubility of the second electrode layer 106 may be higher than the moving-metal-ion solubility of the second solid state electrolyte layer 112. For example, the first electrode layer 104 may comprise materials of high conductivity, such as Pt. The second electrode layer 106 may comprise moving metal containing germanium antimony telluride (GST) materials of high conductivity, such as Cu-GST, Au-GST, Zn-GST and so on, wherein, for example, Cu, Au, Zn function as moving metals. The first solid state electrolyte layer 110 may comprise Hf-oxide, Zr-oxide, or Ta-oxide. The second solid state electrolyte layer 112 may comprise silicon oxide, silicon nitride, or silicon oxynitride.

Referring to FIG. 1, in one embodiment, the memory device 102 may have a first threshold voltage Vt1, a second threshold voltage Vt2, a third threshold voltage Vt3 and a fourth threshold voltage Vt4. In embodiments, the first threshold voltage Vt1 is a threshold voltage Vt-set for the memory device 102 being in a set state. The second threshold voltage Vt2 is a threshold voltage Vt-read set for reading the memory device 102 in the set stat. The third threshold voltage Vt3 is a threshold voltage Vt-reset for the memory device 102 being in a reset state. The fourth threshold voltage Vt4 is a threshold voltage Vt-read reset for reading the memory device 102 in the reset state. In one embodiment, the first threshold voltage Vt1, the second threshold voltage Vt2 and the fourth threshold voltage Vt4 have the same polarity, for example all have positive voltage values. The third threshold voltage Vt3 may have a polarity opposite to those of the first threshold voltage Vt1, the second threshold voltage Vt2 and the fourth threshold voltage Vt4, such as a negative voltage value. In embodiment, an absolute value of the first threshold voltage Vt1 is higher than an absolute value of the second threshold voltage Vt2. The term "threshold voltage" herein can be discussed as an electrical potential difference between the second electrode layer 106 and the first electrode layer 104, wherein the first electrode layer 104 is a common reference such as a ground.

Referring to FIG. 1, in one embodiment, the memory device 102 is a two-terminal memory device such as a conductive bridging RAM (CBRAM). In embodiments, the memory device 102 may use mixed-ionic-electronic-conduction (MIEC) or ovonic threshold switch (OTS) materials and so on.

Figure 2:
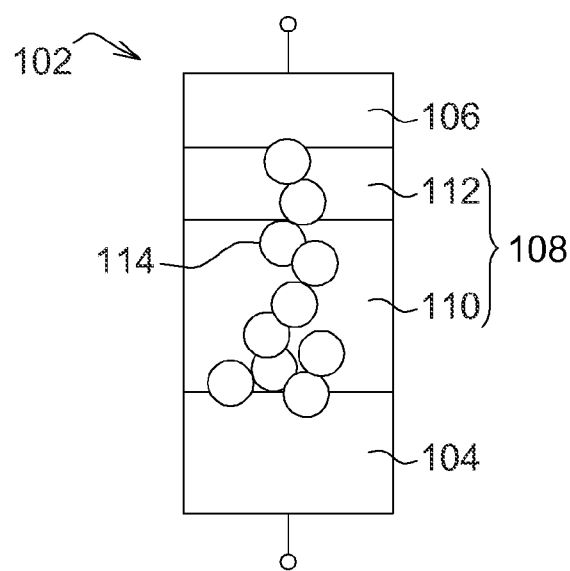
FIG. 2 illustrates a memory device according to one embodiment.
Figure 3:
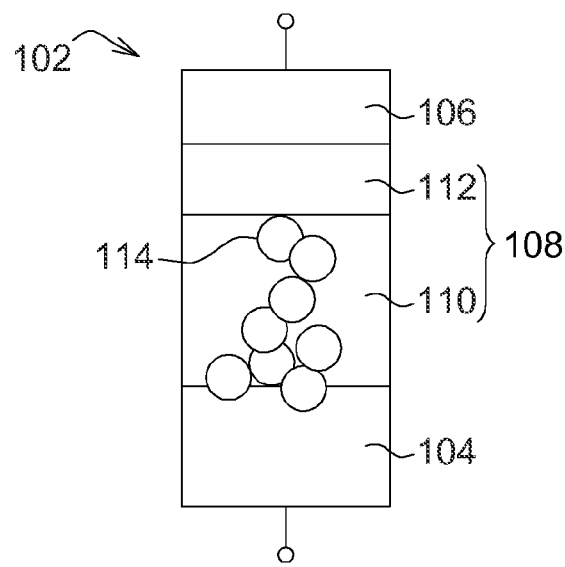
FIG. 3 illustrates a memory device according to one embodiment.

An operating method for the memory device 102 is illustrated with FIGS. 1-3. The term "bias voltage" herein can be discussed as an electrical potential difference between the second electrode layer 106 and the first electrode layer 104, wherein the first electrode layer 104. For example, as the first electrode layer 104 is grounded, a bias voltage is equal to a voltage applied to the second electrode layer 106.

The operating method for the memory device 102 comprises making the memory device 102 being in a set state.

In embodiments, a method for making the memory device 102 being in the set state comprises applying a first bias voltage BV1 to the memory device 102 as shown in FIG. 1. An absolute value of the first bias voltage BV1 is substantially bigger than or equal to an absolute value of the first threshold voltage Vt1 for the memory device 102 being in the set state. Therefore, the moving metal ions are moved from the second electrode layer 106 into the second solid state electrolyte layer 112 and the first solid state electrolyte layer 110 to form a conductive bridge 114 adjoined between the first electrode layer 104 and the second electrode layer 106 as shown in FIG. 2, and thus the memory device 102 has conductivity connection property.

The method for making the memory device 102 being in the set state may comprise, after the memory device 102 has conductivity connection property, stopping applying the first bias voltage BV1 to the memory device 102, for example, by making the first bias voltage BV1 being zero or by applying no voltage to the first electrode layer 104 and the second electrode layer 106, so that the moving metal ions in the conductive bridge 114 spontaneously move out from the second solid state electrolyte layer 112 and thus the conductive bridge 114 is broken from the second solid state electrolyte layer 112, as shown in FIG. 3. The break degree of the conductive bridge 114 is indicated that the moving metal ions are substantially absent in the second solid state electrolyte layer 112. Therefore, the memory device 102 has conductivity break property. The action of the moving metal ions spontaneously removing from the second solid state electrolyte layer 112 is resulted from attraction and absorbability by the first solid state electrolyte layer 110 and the second electrode layer 106, wherein the moving-metal-ion solubility of the first solid state electrolyte layer 110 and the second electrode layer 106 are higher than the moving-metal-ion solubility of the second solid state electrolyte layer 112.

In the step for making the memory device 102 being in the set state, it is not fast and takes a specific relaxation time period for the moving metal ions to spontaneously remove from the second solid state electrolyte layer 112 to break the conductive bridge 114 (FIG. 3) into the break degree that the moving metal ions are substantially absent in the second solid state electrolyte layer 112 for the memory device 102 having conductivity break property. This relaxation time period would affect efficiency of the memory device 102 and would result in current leakage problem to an unselected memory device 102 in a memory array during the relaxation time period. Therefore, in embodiments, after applying the first bias voltage BV1 to form the conductive bridge 114 adjoined between the first electrode layer 104 and the second electrode layer 106 so that the memory device 102 has conductivity connection property as shown in FIG. 2, a recovering bias voltage Vr1 is applied to the memory device 102 to accelerate the breaking efficiency of the conductive bridge 114 from the second solid state electrolyte layer 112 as shown in FIG. 3. Therefore, the set efficiency for the memory device 102 can be improved. In addition, the current leakage problem can be avoided. In one embodiment, a polarity of the recovering bias voltage Vr1 is opposite to the polarity of the first bias voltage BV1. For example, the first bias voltage BV1 is a positive voltage, and the recovering bias voltage Vr1 is a negative voltage. In embodiments, the step for applying the recovering bias voltage Vr1 may be immediately performed after stopping applying the first bias voltage BV1, or may be performed in an acceptable time period, shorter than the relaxation time period, after stopping applying the first bias voltage BV1.

In embodiments, after making the memory device 102 being in the set state, the memory device 102 in the set state is read.

A method for reading the memory device 102 in the set state comprises applying a second bias voltage BV2 to the memory device 102 having conductivity break property as shown in FIG. 3 to move the moving metal ions from the second electrode layer 106 to accumulate to conductive bridge 114 so that the conductive bridge 114 is adjoined between the first electrode layer 104 and the second electrode layer 106 as shown in FIG. 2 and the memory device 102 has conductivity connection property. In embodiment, an absolute value of the second bias voltage BV2 is substantially bigger than or equal to the absolute value of the second threshold voltage Vt2 for the memory device 102 being in the set state. In one embodiment, the second bias voltage BV2 and the first bias voltage BV1 have the same polarity such as positive voltages.

A method for reading the memory device 102 in the set state may comprise after the memory device 102 has conductivity connection property, stopping applying the second bias voltage BV2 to the memory device 102, for example, by making the second bias voltage BV2 being zero or by applying no voltage to the first electrode layer 104 and the second electrode layer 106, so that the moving metal ions in the conductive bridge 114 (FIG. 2) spontaneously move out from the second solid state electrolyte layer 112 and thus the conductive bridge 114 is broken from the second solid state electrolyte layer 112, as shown in FIG. 3. The break degree of the conductive bridge 114 is indicated that the moving metal ions are substantially absent in the second solid state electrolyte layer 112. Therefore, the memory device 102 has conductivity break property. The action of the moving metal ions spontaneously removing from the second solid state electrolyte layer 112 is resulted from attraction and absorbability by the first solid state electrolyte layer 110 and the second electrode layer 106, wherein the moving-metal-ion solubility of the first solid state electrolyte layer 110 and the second electrode layer 106 are higher than the moving-metal-ion solubility of the second solid state electrolyte layer 112.

In the step for reading the memory device 102 in the set state, it is not fast and takes a specific relaxation time period for the moving metal ions to spontaneously remove from the second solid state electrolyte layer 112 to break the conductive bridge 114 (FIG. 3) into the break degree that the moving metal ions are substantially absent in the second solid state electrolyte layer 112 for the memory device 102 having conductivity break property. This relaxation time period would affect read efficiency, read accuracy and read through-put of the memory device 102 and would result in current leakage problem to an unselected memory device 102 in a memory array during the relaxation time period. Therefore, in embodiments, after applying the second bias voltage BV2 to form the conductive bridge 114 adjoined between the first electrode layer 104 and the second electrode layer 106 so that the memory device 102 has conductivity connection property as shown in FIG. 2, a recovering bias voltage Vr2 is applied to the memory device 102 to accelerate the breaking efficiency of the conductive bridge 114 from the second solid state electrolyte layer 112 as shown in FIG. 3. Therefore, the read efficiency, read accuracy and read through-put for the memory device 102 can be improved. In addition, the current leakage problem can be avoided. In one embodiment, a polarity of the recovering bias voltage Vr2 is opposite to the polarity of the second bias voltage BV2. For example, the second bias voltage BV2 is a positive voltage, and the recovering bias voltage Vr2 is a negative voltage. In embodiments, the step for applying the recovering bias voltage Vr2 may be immediately performed after stopping applying the second bias voltage BV2, or may be performed in an acceptable time period, shorter than the relaxation time period, after stopping applying the second bias voltage BV2.

In embodiments, after reading the memory device 102 in the set state, the memory device 102 is made being in a reset state.

A method for making the memory device 102 being in the reset state comprises applying a third bias voltage BV3 to the memory device 102 to attract substantially the whole moving metal ions in the solid state electrolyte structure 108 back to the second electrode layer 106 and recover the memory device 102 to the condition as shown in FIG. 1. In embodiments, a polarity of the third bias voltage BV3 is opposite to the polarity of the first bias voltage BV1 and the polarity of the second bias voltage BV2. For example, the third bias voltage BV3 is a negative voltage. An absolute value of the third bias voltage BV3 is substantially bigger than or equal to the absolute value of the third threshold voltage Vt3 of the memory device 102. In embodiments, the recovering bias voltages Vr1, Vr2 and the third bias voltage BV3 have the same polarity. The absolute values of the recovering bias voltages Vr1, Vr2 are smaller than the absolute value of the third bias voltage BV3.

In embodiments, after making the memory device 102 being in the reset state, the memory device 102 in the reset state is read.

A method for reading the memory device 102 in the reset state comprises applying a fourth bias voltage BV4 to the memory device 102 having conductivity break property as shown in FIG. 1 to move the moving metal ions from the second electrode layer 106 into the solid state electrolyte structure 108 to form the conductive bridge 114 adjoined between the first electrode layer 104 and the second electrode layer 106 as shown in FIG. 2 so that the memory device 102 has conductivity connection property. In embodiment, a polarity of the fourth bias voltage BV4 is opposite to a polarity of the third bias voltage BV3. For example, the fourth bias voltage BV4 is a positive voltage. An absolute value of the fourth bias voltage BV4 is substantially bigger than or equal to the absolute value of the fourth threshold voltage Vt4 of the memory device 102. In some embodiments, the method for reading the memory device 102 in the reset state may comprise, after the memory device 102 has conductivity connection property, stopping applying the fourth bias voltage BV4 to the memory device 102.

In embodiments, the operating method for the memory device 102 may be applied various two-terminal memory devices such as a conductive bridging RAM (CBRAM), a mixed-ionic-electronic-conduction (MIEC), an ovonic threshold switch (OTS) materials and so on.

Figure 4:
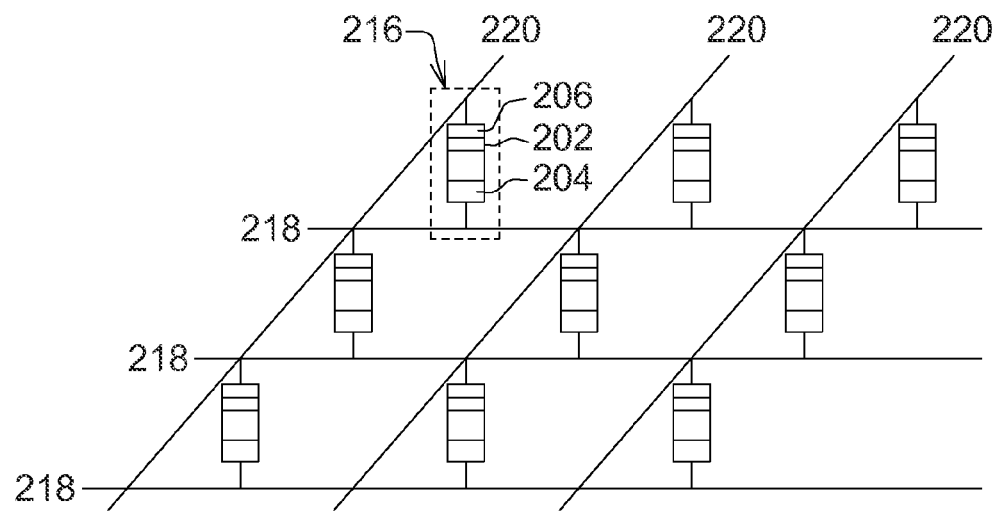
FIG. 4 illustrates a memory array according to one embodiment.

FIG. 4 illustrates a memory array according to one embodiment. The memory array comprises memory cells 216. Each of the memory cells 216 comprises a first conductive line 218, a second conductive line 220 and a memory device 202. The memory device 202 may be similar to the memory device 102 as shown in FIG. 1. In one embodiment, the memory device 202 is a two-terminal memory device such as a CBRAM. The first electrode layer 204 of the memory device 202 is electrically connected to the first conductive line 218. The second electrode layer 206 of the memory device 202 is electrically connected to the second conductive line 220. The first conductive line 218 may be one of a word line and a bit line. The second conductive line 220 may be the other of the word line and the bit line.

Referring to FIG. 4, in an operating method for the memory array, bias voltages are applied to the memory devices 202 by the first conductive lines 218 and the second conductive lines 220 to perform the steps for set, reset, read, applying recovering bias voltage and so on illustrated with FIGS. 1-3. Selected memory devices 202 are sensed while unselected memory devices 202 are prevented from the current leakage problem.

Referring to FIG. 4, in one embodiment, there is only memory device 202 electrically connected between the first conductive line 218 and the second conductive line 220. Therefore, a pure 1R cross-point array can be realized, without utilizing additional driving, accessing devices. Thus, the memory array can have a high element density and low cost.

Figure 5:
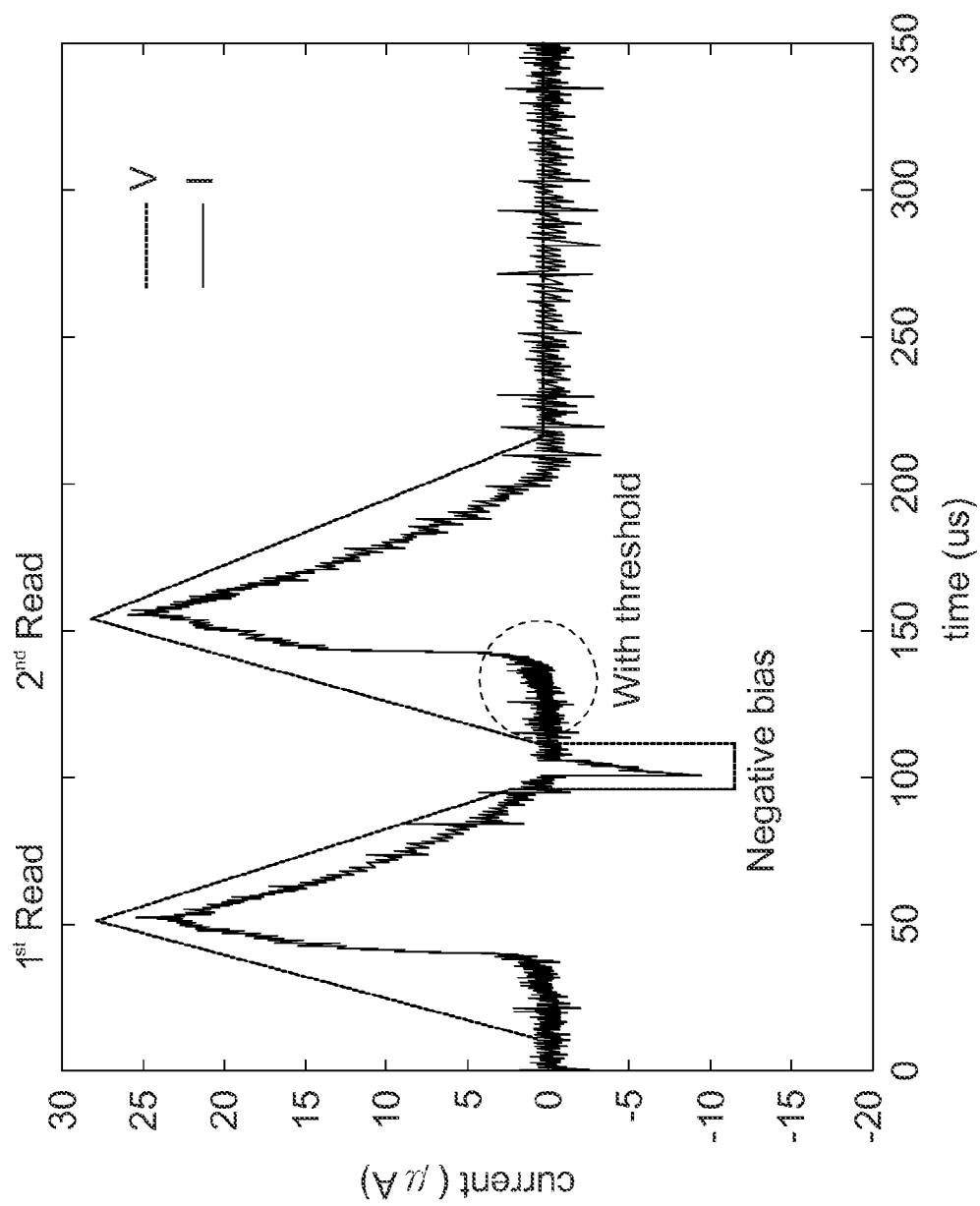
FIG. 5 shows an electrical characteristic curve of a memory device in one embodiment.

FIG. 5 shows an electrical characteristic curve of the memory device in one embodiment. A negative recovering bias voltage is applied between the first positive read bias voltage (1st read) and the second positive read bias voltage (2st read). From FIG. 5, it is found that even a time gap between the two read bias voltages is very short, the memory device shows a threshold switching characteristic as the second read bias voltage is applied to the memory device.

Figure 6:
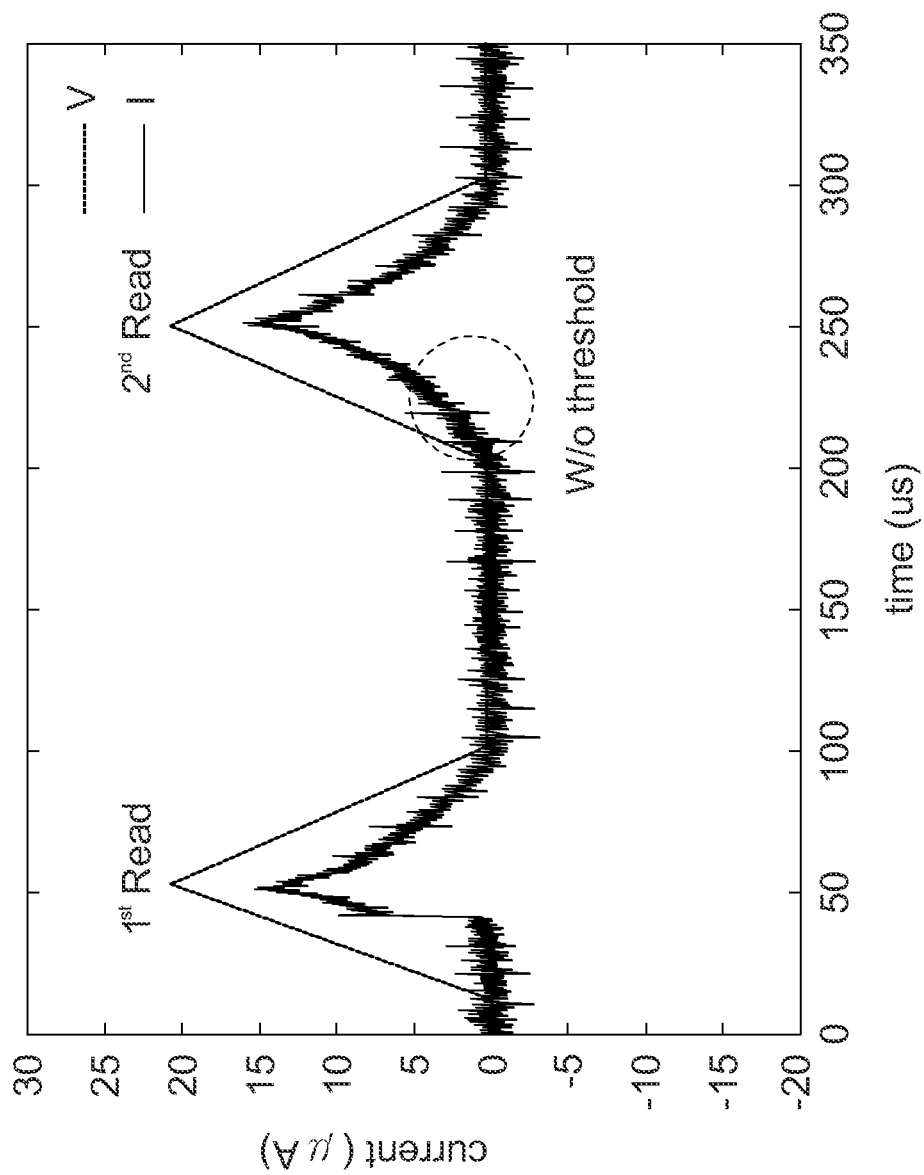
FIG. 6 shows an electrical characteristic curve of a memory device in one embodiment.

FIG. 6 shows an electrical characteristic curve of the memory device in one embodiment. No negative recovering bias voltage is applied between the first positive read bias voltage (1st read) and the second positive read bias voltage (2st read). From FIG. 6, it is found that even a time gap between the two read bias voltages is very long, the memory device shows no threshold switching characteristic as the second read bias voltage is applied to the memory device.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An operating method for a memory device, comprising:
    making a memory device being in a set state, wherein a method for making the memory device being in the set state includes applying a first bias voltage to the memory device; and
    reading the memory device in the set state, wherein a method for reading the memory device in the set state includes applying a second bias voltage to the memory device; wherein
    at least one of the method for making the memory device being in the set state and the method for reading the memory device in the set state further comprises applying a recovering bias voltage to the memory device after the step for applying the first bias voltage or the step for applying the second bias voltage.

2. The operating method for a memory device according to claim 1, wherein the step for applying the recovering bias voltage is between the step for applying the first bias voltage and the step for applying the second bias voltage.

3. The operating method for a memory device according to claim 1, wherein both of the method for making the memory device being in the set state and the method for reading the memory device in the set state further comprises the step for applying the recovering bias voltage after the step for applying the first bias voltage and the step for applying the second bias voltage.

4. The operating method for a memory device according to claim 1, wherein the step for reading the memory device in the set state is after the step for making the memory device being in the set state.

5. The operating method for a memory device according to claim 1, wherein a polarity of the recovering bias voltage is opposite to a polarity of the first bias voltage and a polarity of the second bias voltage.

6. The operating method for a memory device according to claim 1, wherein the first bias voltage is substantially bigger than or equal to a first threshold voltage of the memory device for being in the set state, the second bias voltage is substantially bigger than or equal to a second threshold voltage of the memory device for reading the set state.

7. The operating method for a memory device according to claim 1, wherein the memory device has a first threshold voltage and a second threshold voltage, a polarity of the first threshold voltage and a polarity of the second threshold voltage are the same, an absolute value of the first threshold voltage and an absolute value of the second threshold voltage are different.

8. The operating method for a memory device according to claim 7, wherein the first threshold voltage is a threshold voltage for the memory device to be in the set state, the second threshold voltage is a threshold voltage for reading the memory device in the set state.

9. The operating method for a memory device according to claim 7, wherein the absolute value of the first threshold voltage is bigger than the absolute value of the second threshold voltage.

10. The operating method for a memory device according to claim 1, wherein the memory device includes:
    a first electrode layer;
    a second electrode layer; and
    a solid state electrolyte structure adjoined between the first electrode layer and the second electrode layer, wherein the second electrode layer is functioned as a source for moving metal ions that can move into the solid state electrolyte structure.

11. The operating method for a memory device according to claim 10, wherein the solid state electrolyte structure includes:
    a first solid state electrolyte layer adjoined to the first electrode layer; and
    a second solid state electrolyte layer adjoined between the first solid state electrolyte layer and the second electrode layer.

12. The operating method for a memory device according to claim 11, wherein the step for applying the first bias voltage to the memory device moves the moving metal ions from the second electrode layer into the second solid state electrolyte layer and the first solid state electrolyte layer to form a conductive bridge adjoined between the first electrode layer and the second electrode layer.

13. The operating method for a memory device according to claim 12, wherein the step for applying the recovering bias voltage to the memory device removes the moving metal ions from the second solid state electrolyte layer to break the conductive bridge from the second solid state electrolyte layer.

14. The operating method for a memory device according to claim 1, wherein the step for making the memory device being in the set state further includes after the step for applying the first bias voltage to the memory device, stopping applying the first bias voltage to the memory device.

15. The operating method for a memory device according to claim 1, wherein the step for reading the memory device in the set state further includes after step for applying the second bias voltage to the memory device, stopping applying the second bias voltage to the memory device.

16. The operating method for a memory device according to claim 1, further comprising:
    making the memory device being in a reset state, wherein a method for making the memory device being in the reset state includes applying a third bias voltage to the memory device; and
    reading the memory device in the reset state, wherein a method for reading the memory device in the reset state includes applying a fourth bias voltage to the memory device.

17. The operating method for a memory device according to claim 16, wherein a polarity of the third bias voltage is opposite to a polarity of the fourth bias voltage, a polarity of the recovering bias voltage and the polarity of the third bias voltage are the same, an absolute value of the recovering bias voltage is smaller than an absolute value of the third bias voltage.

18. The operating method for a memory device according to claim 1, wherein the memory device is a two-terminal memory device.

19. An operating method for a memory array, comprising:
    making a two-terminal memory device electrically connected between a word line and a bit line being in a set state, wherein a method for making the two-terminal memory device in the set state includes applying a first bias voltage to the two-terminal memory device through the word line and the bit line; and reading the two-terminal memory device in the set state, wherein a method for reading the two-terminal memory device in the set state includes applying a second bias voltage to the two-terminal memory device through the word line and the bit line; wherein at least one of the method for making the two-terminal memory device in the set state and the method for reading the two-terminal memory device in the set state further comprises applying a recovering bias voltage to the two-terminal memory device through the word line and the bit line after the step for applying the first bias voltage or the step for applying the second bias voltage.

20. A memory array, comprising memory cells, wherein each of the memory cells includes:
a first conductive line;
a second conductive line; and
a memory device, including:
a first electrode layer electrically connected to the first conductive line;
a second electrode layer electrically connected to the second conductive line, the second electrode layer comprising a moving metal containing germanium antimony telluride (GST) material; and
a solid state electrolyte structure adjoined between the first electrode layer and the second electrode layer, wherein the second electrode layer is functioned as a source for moving metal ions, the moving metal ions can move into the solid state electrolyte structure.

* * * * *